(12) United States Patent
Sumi

(10) Patent No.: US 10,045,470 B2
(45) Date of Patent: Aug. 7, 2018

(54) COMPONENT MOUNTING METHOD

(71) Applicant: Panasonic Intellectual Property Management Co., Ltd., Osaka (JP)

(72) Inventor: Hideki Sumi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 268 days.

(21) Appl. No.: 14/799,814

(22) Filed: Jul. 15, 2015

(65) Prior Publication Data

US 2016/0029493 A1    Jan. 28, 2016

(30) Foreign Application Priority Data

Jul. 23, 2014   (JP) ................. 2014-149646

(51) Int. Cl.
| | |
|---|---|
| *H05K 13/02* | (2006.01) |
| *H05K 13/00* | (2006.01) |
| *H05K 3/12* | (2006.01) |
| *H05K 3/34* | (2006.01) |

(52) U.S. Cl.
CPC ....... *H05K 13/0061* (2013.01); *H05K 3/1233* (2013.01); *H05K 3/341* (2013.01); *H05K 3/3484* (2013.01)

(58) Field of Classification Search
CPC ........ G06F 19/00; H05K 13/02; H05K 13/04; H05K 3/1233; H05K 3/341; H05K 3/3484; H05K 13/0061
See application file for complete search history.

(56) References Cited

U.S. PATENT DOCUMENTS

| | | | | |
|---|---|---|---|---|
| 7,036,213 | B2 * | 5/2006 | Kabeshita | H05K 13/0061 29/740 |
| 8,315,728 | B2 * | 11/2012 | Maenishi | G05B 19/41865 700/100 |
| 8,375,570 | B2 * | 2/2013 | Nagao | B23K 1/0016 29/739 |
| 8,402,639 | B2 * | 3/2013 | Nagao | H05K 13/08 29/740 |
| 8,646,676 | B2 * | 2/2014 | Nagao | H05K 13/0452 228/180.21 |
| 8,833,634 | B2 * | 9/2014 | Nagao | H05K 13/08 228/180.21 |

(Continued)

FOREIGN PATENT DOCUMENTS

| | | |
|---|---|---|
| JP | 2003-204192 A | 7/2003 |
| JP | 2003-204193 A | 7/2003 |

(Continued)

*Primary Examiner* — Carl Arbes
(74) *Attorney, Agent, or Firm* — Pearne & Gordon LLP

(57) ABSTRACT

A component mounting line includes a component mounting apparatus and a board distributing apparatus. The component mounting apparatus includes two transport lanes, each having a carry-in area where a board is carried and a mounting area where a component is mounted onto the board received from the carry-in area. The board distributing apparatus distributes the board to any one of the two transport lanes. The board distributing apparatus distributes the board to any one of the two transport lanes based on a presence or absence of boards in the carry-in area and the mounting area.

3 Claims, 7 Drawing Sheets

(56) References Cited

U.S. PATENT DOCUMENTS

2011/0180588 A1* 7/2011 Nagao .................... H05K 13/08
228/6.2
2014/0157591 A1  6/2014 Nagai

FOREIGN PATENT DOCUMENTS

| JP | 2008-251586 A | 10/2008 |
| JP | 4278903 B2 * | 6/2009 |
| JP | 4346849 B2 * | 10/2009 |
| JP | 2011071519 A * | 4/2011 |
| JP | 2013-74006 A | 4/2013 |

* cited by examiner

COMPONENT MOUNTING METHOD

CROSS-REFERENCES TO RELATED APPLICATION(S)

This application is based on and claims priority from Japanese Patent Application No. 2014-149646 filed on Jul. 23, 2014, the entire contents of which are incorporated herein by reference.

BACKGROUND

1. Field of the Invention

The present invention relates to a component mounting line that includes a component mounting apparatus that mounts a component onto a board and a board distributing apparatus that distributes the board, a component mounting apparatus, and a component mounting method.

2. Description of Related Art

In the related art, a component mounting line for manufacturing a component-mounted board includes a printer that prints solder paste to a board, and a component mounting apparatus that mounts a component onto the board where the solder paste is printed. The component mounting apparatus includes a transport lane that transports the board to be positioned at a mounting operation position. The transport lane includes a carry-in area where the board is carried from an upstream side apparatus, and a mounting area where the component is mounted on the board.

The transport lane includes a conveyor mechanism split in plural, which includes a carry-in conveyor disposed in a carry-in area, and a mounting conveyor disposed in a mounting area. A board carried from an upstream side apparatus is sequentially transported to the carry-in conveyor and the mounting conveyor, and then, is carried to a downstream side apparatus after a component is mounted thereon in the mounting area. As such a board transport method using the transport lane, a technique for carrying the board from the upstream side apparatus to the carry-in area and keeping the board in the carry-in area while the component mounting operation is performed for the board that is present in the mounting area is known. Thus, it is possible to shorten a waiting time as much as possible until the board is transported to the mounting area, to thereby suppress a reduction in production efficiency.

In recent years, in order to improve production efficiency, a component mounting apparatus of a dual lane type that includes two transport lanes described above and performs the component mounting operation in parallel in the respective transport lanes has been widely used. In order to handle the board production using such a component mounting apparatus, a component mounting line in which a board distributing apparatus is disposed between a printer and a component mounting apparatus has been proposed (for example, see JP-A-2013-74006 as Patent Literature 1).

The board distributing apparatus distributes a board received from the printer to any one of two transport lanes of the component mounting apparatus. An output section provided in the component mounting apparatus outputs a signal (board carry-in preparation completion flag) if a board carry-in preparation in the transport lane is completed (in other words, the board that is present in the carry-in area is carried to the mounting area). The board distributing apparatus determines a transport lane which is a distribution destination based on the signal output from the output section.

Patent Literature 1: JP-A-2013-74006

SUMMARY

However, in the related art, since the output section outputs a signal based on only a board carry-in preparation situation in each transport lane, when the board carry-in preparation is completed in both the two transport lanes, two signals are overlappingly output to the board distributing apparatus. In this case, since the board distributing apparatus that receives two of the signals distributes the board to a predetermined transport lane among the two transport lanes regardless of operation situations of the two transport lanes, it is difficult to carry the board in consideration of production efficiency.

Specifically, even though the component mounting operation is not completed for the board that is present in the mounting area, the output section outputs a signal to the board distributing apparatus if the board is not present in the carry-in area. Accordingly, in the related art, even though the transport lane where the component mounting operation is not performed is present, the board distributing apparatus distributes the board to the other transport lane where the component mounting operation is performed, which causes a reduction in production efficiency.

Accordingly, a non-limited object of embodiments of the present invention is to provide a component mounting line, a component mounting apparatus, and a component mounting method capable of carrying a board to an appropriate transport lane to suppress a reduction in production efficiency.

An aspect of the present invention provides a component mounting line including: a component mounting apparatus that includes two transport lanes, each having a carry-in area where a board is carried and a mounting area where a component is mounted onto the board received from the carry-in area; and a board distributing apparatus that distributes the board to any one of the two transport lanes, wherein the board distributing apparatus distributes the board to any one of the two transport lanes based on a presence or absence of boards in the carry-in area and the mounting area.

Another aspect of the present invention provides a component mounting apparatus that mounts a component onto a board distributed by a board distributing apparatus, the component mounting apparatus including: two transport lanes, each having a carry-in area where the board distributed by the board distributing apparatus is carried and a mounting area where the component is mounted on the board received from the carry-in area; a transport lane determining section that determines which one of the two transport lanes the board from the board distributing apparatus is carried to based on a presence or absence of boards in the carry-in area and the mounting area; and an output section that outputs a board request signal for requesting a distribution of the board to a transport lane determined by the transport lane determining section to the board distributing apparatus.

Still another aspect of the present invention provides a component mounting method in a component mounting apparatus that mounts a component onto a board distributed by a board distributing apparatus, in which the component mounting apparatus includes two transport lanes, each having a carry-in area where the board distributed by the board distributing apparatus is carried and a mounting area where the component is mounted on the board received from the carry-in area, the method including: determining which one of the two transport lanes the board from the board distributing apparatus is carried to based on a presence or absence of boards in the carry-in area and the mounting area, and outputting a board request signal for requesting a distribution of the board to the determined transport lane to the board distributing apparatus; and mounting the component onto the board distributed to the transport lane for which the board is requested.

According to the aspects of the present invention, it may be possible to carry a board to an appropriate lane to suppress a reduction in production efficiency.

DETAILED DESCRIPTION

Embodiment 1

Figure 1:
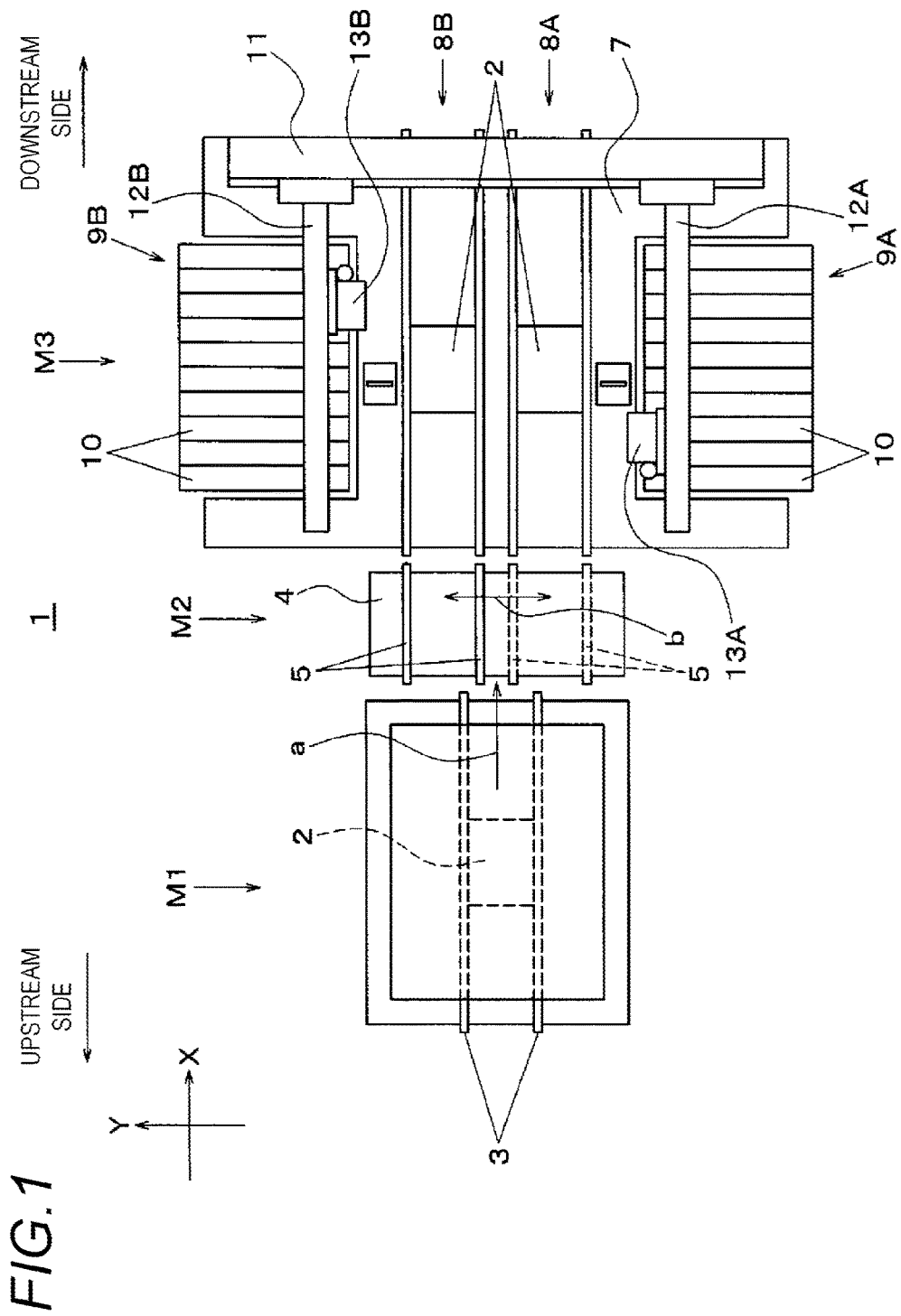
FIG. 1 is a plan view of a component mounting line according to Embodiment 1 of the present invention.

First, a configuration of a component mounting line 1 according to Embodiment 1 of the present invention will be described with reference to FIG. 1. The component mounting line 1 has a function of manufacturing a component-mounted board in which a component is mounted on a board 2 using solder paste. The component mounting line 1 has a configuration in which a printer M1, a board distributing apparatus M2, and a component mounting apparatus M3 are arranged in connection in an X direction which is a transport direction of the board 2. Hereinafter, a direction orthogonal to the X direction in a horizontal plane is defined as a Y direction. Further, in FIG. 1, a left side on the paper is referred to as an upstream side, and a right side on the paper is referred to as a downstream side.

The printer M1 has a function of printing solder paste for bonding a component to an electrode of the board 2 by a printing mechanism (not shown). The printer M1 includes a pair of transport conveyors 3 that extend in the X direction. The transport conveyors 3 transport the board 2 to be positioned at a predetermined printing position, or carry the board 2 onto which the solder paste is printed to the board distributing apparatus M2 (arrow a).

Figure 3:
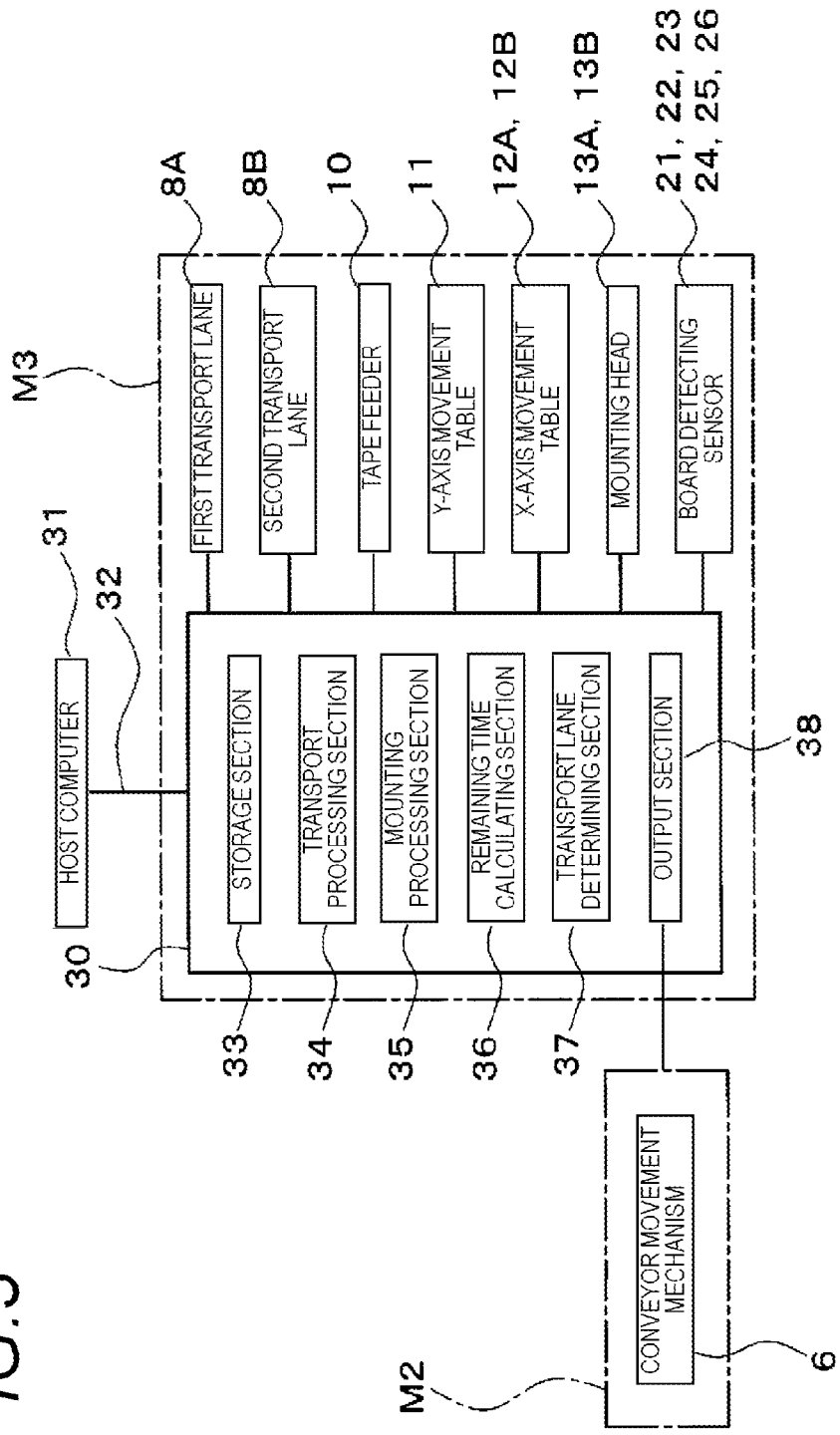
FIG. 3 is a block diagram illustrating a configuration of a control system of the component mounting line according to Embodiment 1 of the present invention.

The board distributing apparatus M2 includes a pair of transport conveyors 5 that extend in the X direction on a base 4. The transport conveyors 5 are movable in the Y direction (arrow b) by a conveyor movement mechanism 6 (FIG. 3). The board distributing apparatus M2 distributes the board 2 carried from the printer M1 into any one of a first transport lane 8A or a second transport lane 8B provided in the component mounting apparatus M3 to be described later.

The component mounting apparatus M3 has a function of mounting a component onto the board 2 distributed by the board distributing apparatus M2. At the center of the base 7, the first transport lane 8A and the second transport lane 8B that extend in the X direction are provided in a state of being arranged in parallel in the Y direction. For ease of description, the first transport lane 8A and the second transport lane 8B are simply referred to as "transport lanes 8A and 8B" except when it is necessary to distinctly describe the first transport lane 8A and the second transport lane 8B. The transport lanes 8A and 8B have a function of transporting the board 2 carried from the board distributing apparatus M2 to be positioned at a predetermined mounting operation position (position of the board 2 indicated by a solid line).

On both sides of the transport lanes 8A and 8B, component supply sections 9A and 9B are respectively provided. In the component supply sections 9A and 9B, plural tape feeders 10 that are arranged in parallel in the X direction are set. The tape feeder 10 pitch-feeds a component held by a carrier tape to supply the component to a pick-up position by mounting heads 13A and 13B (which will be described later).

A Y-axis movement table 11 is provided in one end portion of the base 7 in the X direction, and two X-axis movement tables 12A and 12B are combined with the Y-axis movement table 11 to be movable in the Y direction. In the X-axis movement tables 12A and 12B, the mounting heads 13A and 13B are provided to be movable in the X direction, respectively. The Y-axis movement table 11 and the X-axis movement tables 12A and 12B form a head movement mechanism that moves the mounting heads 13A and 13B in the X direction and the Y direction.

The mounting heads 13A and 13B pick up components that are respectively supplied from the component supply sections 9A and 9B, and mount the components onto the boards 2 positioned at the mounting operation positions. Here, the mounting head 13A may use only the board 2 transported by the first transport lane 8A as an operation target, or may use both the boards 2 transported by the transport lanes 8A and 8B as operation targets. Similarly, the mounting head 13B may use only the board 2 transported by the second transport lane 8B as an operation target, or may use both the boards 2 transported by the transport lanes 8A and 8B as operation targets. The component mounting apparatus M3 in Embodiment 1 may perform the component mounting operation in parallel with respect to two sheets of boards transported by the transport lanes 8A and 8B.

Figure 2:
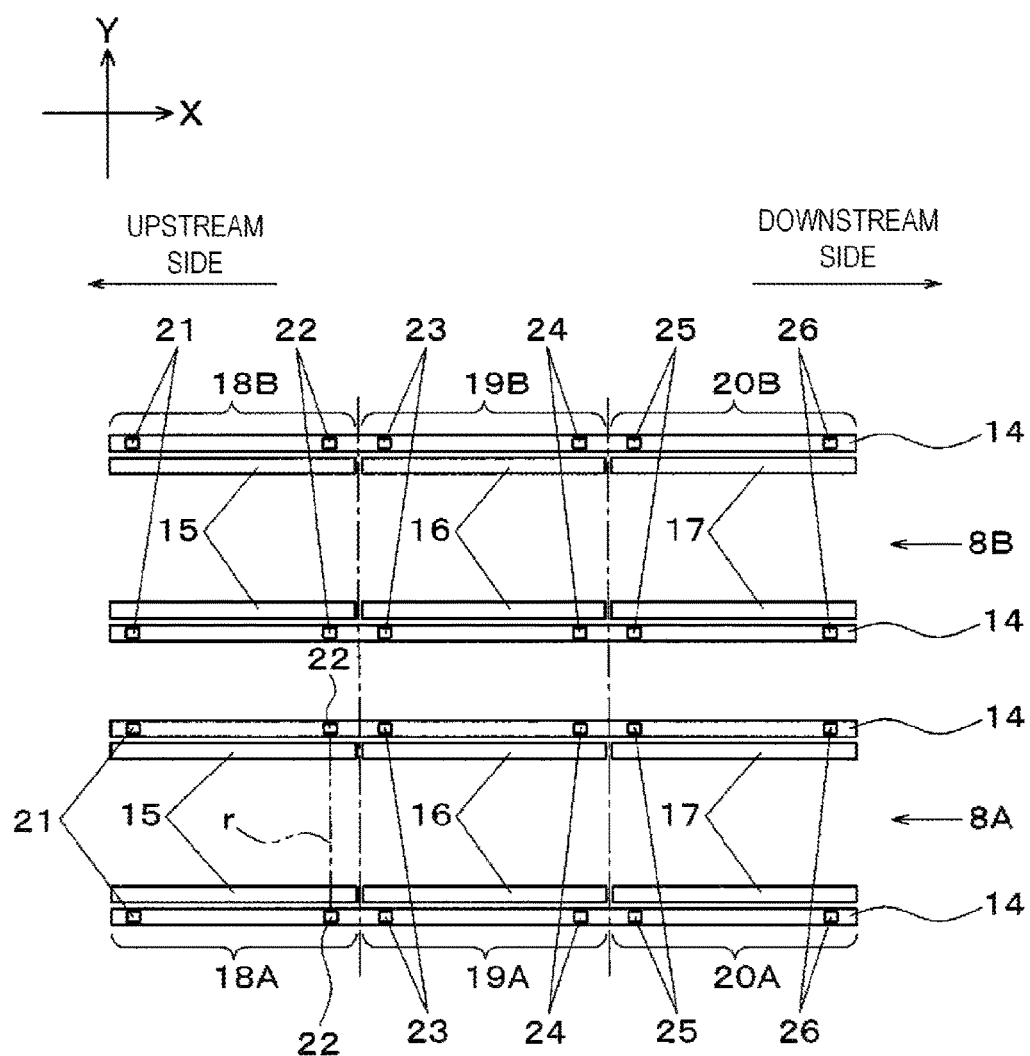
FIG. 2 is a plan view of a transport lane in which a component mounting apparatus that forms the component mounting line according to Embodiment 1 of the present invention is provided.

Next, the transport lanes 8A and 8B will be described in detail with reference to FIG. 2. The transport lanes 8A and 8B include a pair of transport lanes 14 that extends in the X direction. A conveyor mechanism split in plural (here, three) is arranged inside the transport lanes 14. The conveyor mechanism includes a pair of carry-in conveyors 15, a pair of mounting conveyors 16, and a pair of carry-out conveyors 17 that are sequentially arranged from the upstream side.

Each carry-in conveyor 15 transfers the board 2 received from the board distributing apparatus M2 to the mounting conveyor 16. Each mounting conveyor 16 transports the board 2 received from the carry-in conveyor 15 to be positioned at the mounting operation position, and transfer the board 2 on which the component is mounted to the carry-out conveyor 17. Each carry-out conveyor 17 carries the board 2 received from the mounting conveyors 16 to a downstream side apparatus. These conveyors may individually include a drive source to independently transport the board 2. Accordingly, even when the component mounting operation for the board 2 held on the mounting conveyors 16 is not terminated, the carry-in conveyors 15 may receive the board 2 from the board distributing apparatus M2 for standby.

In each of the transport lanes 8A and 8B, areas where the carry-in conveyors 15 are arranged correspond to carry-in areas 18A and 18B where the boards 2 distributed by the board distributing apparatus M2 are carried. Further, areas where the mounting conveyors 16 are arranged correspond to mounting areas 19A and 19B where the components are mounted onto the boards 2 received from the carry-in areas 18A and 18B. Furthermore, areas where the carry-out conveyors 17 are arranged correspond to carry-out areas 20A and 20B where the boards 2 onto which the components are mounted are carried to the downstream side apparatus.

In this way, the transport lanes 8A and 8B have the carry-in areas 18A and 18B and the mounting areas 19A and 19B. Further, the transport lanes 8A and 8B include the carry-in conveyors 15 that are arranged in the carry-in areas 18A and 18B to carry the boards 2 distributed by the board distributing apparatus M2. Furthermore, the transport lanes 8A and 8B include the mounting conveyors 16 that are arranged in the mounting areas 19A and 19B and transport the boards 2 carried by the carry-in conveyors 15 to be positioned at the mounting operation positions.

In the pair of transport lanes 14, at positions corresponding to respective opposite ends of the carry-in areas 18A and 18B, a pair of board detecting sensors 21 and a pair of board detecting sensors 22 are provided to face each other. Similarly, at positions corresponding to respective opposite ends of the mounting areas 19A and 19B, a pair of board detecting sensors 23 and a pair of board detecting sensors 24 are provided to face each other. Further, at positions corresponding to respective opposite ends of the carry-out areas 20A and 20B, a pair of board detecting sensors 25 and a pair of board detecting sensors 26 are provided to face each other.

The board detecting sensors 21 to 26 are optical sensors in which a light emitting section and a light receiving section are combined. The light emitting section emits inspection light r in the Y direction toward the light receiving section. The board detecting sensors 21, 23, and 25 detect the presence or absence of the board 2 carried from the upstream side according to whether the board 2 blocks the inspection light r. If the board detecting sensors 21, 23, and 25 detect the board 2, the carry-in conveyors 15, the mounting conveyors 16, and the carry-out conveyors 17 respectively start driving to transport the board 2 to each area. Further, the board detecting sensors 22, 24, and 26 detect the presence or absence of the board 2 in each area according to whether the board 2 blocks the inspection light r. If the board detecting sensors 22, 24, and 26 detect the board 2, the carry-in conveyors 15, the mounting conveyors 16, and the carry-out conveyors 17 respectively stop the driving to position the board 2 in each area.

Next, a configuration of a control system of the component mounting apparatus M3 will be described with reference to FIG. 3. A control unit 30 provided in the component mounting apparatus M3 is connected to communicate with a host computer 31 provided outside the component mounting line 1 through a communication network 32. The host computer 31 has a function of managing the component mounting line 1, and stores a variety of data necessary for mounting a component onto the board 2, such as production data.

The control unit 30 includes a storage section 33, a transport processing section 34, a mounting processing section 35, a remaining time calculating section 36, a transport lane determining section 37, and an output section 38. Further, the control unit 30 is connected to the first transport lane 8A, the second transport lane 8B, the tape feeders 10, the Y-axis movement table 11, the X-axis movement tables 12A and 12B, the mounting heads 13A and 13B, and the board detecting sensors 21, 22, 23, 24, 25, and 26. The control unit 30 may be implemented by a processing unit such as a Central Processing Unit (CPU) and a memory such as a Random Access Memory (RAM).

The storage section 33 stores a variety of data downloaded from the host computer 31. The transport processing section 34 individually controls the carry-in conveyors 15, the mounting conveyors 16, and the carry-out conveyors 17 that form the transport lanes 8A and 8B to transport the board 2. The mounting processing section 35 controls the tape feeders 10, the Y-axis movement table 11, the X-axis movement tables 12A and 12B, and the mounting heads 13A and 13B to mount the component onto the board 2 positioned at the mounting operation position.

The remaining time calculating section 36 calculates a remaining time until the component mounting operation for the board 2 positioned at the mounting operation position in the mounting areas 19A and 19B is terminated. The calculation may be performed using an arbitrary method. For example, the remaining time calculating section 36 may count an elapsed time from the time when the board detecting sensor 24 detects the board 2, and may calculate the remaining time by subtracting the counted time from a mounting time calculated in advance for each board. Further, the remaining time calculating section 36 may calculate the remaining time based on a progress situation of the component mounting operation.

The transport lane determining section 37 determines which one of the two transport lanes 8A and 8B that the board 2 from the board distributing apparatus M2 is carried to based on the presence or absence of the board 2 in the carry-in areas 18A and 18B and the mounting areas 19A and 19B. The determination of the presence or absence of the board 2 in each area is performed based on a detection result of the board 2 by the board detecting sensors 21 and 22. When the board 2 is present in the mounting areas 19A and 19B of the transport lanes 8A and 8B, the transport lane determining section 37 determines the transport lane 8A or 8B having less remaining time of the component mounting operation calculated by the remaining time calculating section 36 as a carry-in destination of the board 2.

The output section 38 is connected to the board distributing apparatus M2, and outputs a signal (hereinafter, referred to as a "board request signal") for requesting a distribution of the board 2 to the transport lane 8A or 8B determined by the transport lane determining section 37 to the board distributing apparatus M2. The conveyor movement mechanism 6 provided in the board distributing apparatus M2 moves the transport conveyors 5 to a position which is arranged in parallel in the X direction with respect to the transport lane 8A or 8B for which the request of the board 2 is received. Further, the transport conveyors 5 carry the board 2 to the transport lane 8A or 8B for which the request of the board 2 is received.

Figure 4:
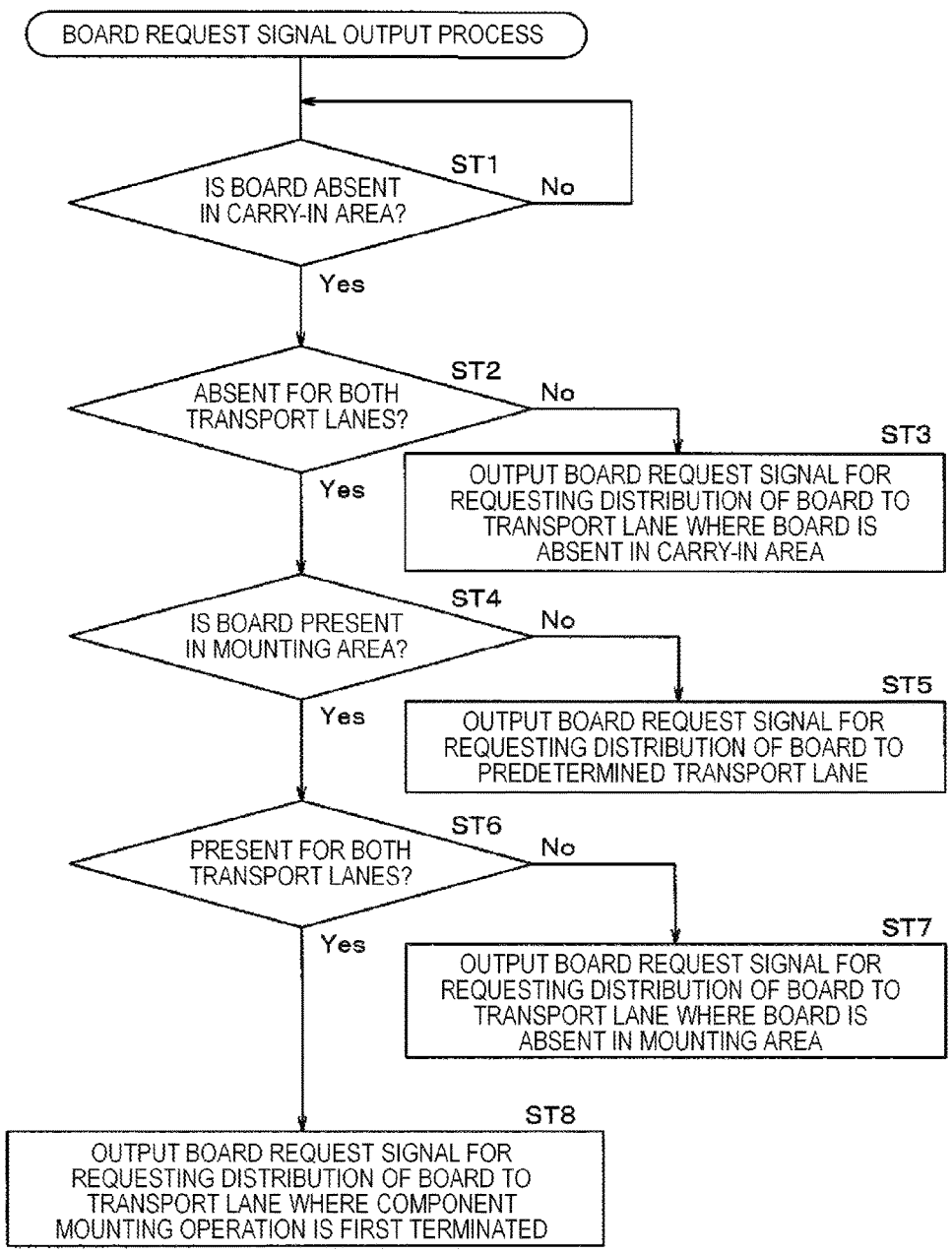
FIG. 4 is a flowchart of a board request signal output process according to Embodiment 1 of the present invention.

With respect to the component mounting line 1 of Embodiment 1 having the above-described configuration, a process of outputting the board request signal (board request signal output process) to the board distributing apparatus M2 will be described with the flowchart of FIG. 4. First, the control unit 30 (transport lane determining section 37) determines whether the board 2 is absent in the carry-in areas 18A and 18B based on the detection result by the board detecting sensor 22 (ST1: carry-in area board presence/absence determining process). When the determination result in ST1 is "No", that is, when the boards 2 are present in both the carry-in areas 18A and 18B, the procedure returns to ST1. That is, the control unit 30 repeats ST1 until the board 2 that is present in any of the carry-in areas 18A and 18B is carried to the mounting areas 19A and 19B.

When the determination result is "Yes" in ST1, that is, when the boards 2 are absent in the carry-in areas 18A and 18B, the control unit 30 determines whether the boards 2 are absent in the carry-in areas 18A and 18B of both the transport lanes 8A and 8B (ST2: board absence carry-in area determining process). When the determination result is "No" in ST2, that is, when the board 2 is present in any of the carry-in areas 18A and 18B, the control unit 30 (transport lane determining section 37) determines the transport lane 8A or 8B where the board 2 is absent in the carry-in area 18A or 18B as a carry-in destination of the board 2. Further, the control unit 30 (output section 38) outputs a board request signal for requesting a distribution of the board 2 to the determined transport lane 8A or 8B to the board distributing apparatus M2 (ST3: first board request signal output process).

When the determination result is "Yes" in ST2, that is, when the boards 2 are absent in both the carry-in areas 18A and 18B, the control unit 30 determines whether the boards 2 are present in the mounting areas 19A and 19B based on a detection result by the board detecting sensor 24 (ST4: mounting area board presence/absence determining process). When the determination result is "No" in ST4, that is, when the boards 2 are absent in both the mounting areas 19A and 19B, the control unit 30 determines a predetermined transport lane 8A or 8B as a carry-in destination of the board 2. Further, the control unit 30 outputs a board request signal for requesting a distribution of the board 2 to the determined transport lane 8A or 8B to the board distributing apparatus M2 (ST5: second board request signal output process). The reason why the board 2 is transported to the predetermined transport lane 8A or 8B is because a specific difference in production efficiency does not occur even though the board 2 is carried to any one of the transport lanes 8A and 8B.

When the determination result is "Yes" in ST4, that is, when the board 2 is present in the mounting areas 19A and 19B, the control unit 30 determines whether the boards 2 are present in the mounting areas 19A and 19B of both the transport lanes 8A and 8B (ST6: board presence mounting area determining process). When the determination result is "No" in ST6, that is, when the board 2 is only present in any one of the mounting areas 19A and 19B, the control unit 30 determines the transport lane 8A or 8B where the board 2 is absent in the mounting area 19A or 19B as a carry-in destination of the board 2. Further, the control unit 30 outputs a board request signal for requesting a distribution of the board 2 to the determined transport lane 8A or 8B (ST7: third board request signal output process).

When the determination result is "Yes" in ST6, that is, when the boards 2 are present in both the mounting areas 19A and 19B, the control unit 30 determines the transport lane 8A or 8B where the component mounting operation is first terminated (remaining mounting time is short) as a carry-in destination of the board 2. Further, the control unit 30 outputs a request signal for requesting a distribution of the board 2 to the determined transport lane 8A or 8B to the board distributing apparatus M2 (ST8: fourth board request signal output process). In this process, the control unit 30 determines the transport lane 8A or 8B where the component mounting operation is first terminated based on the remaining time of the component mounting operation calculated by the remaining time calculating section 36. The board request signal output process is terminated through the above-described processes.

The board distributing apparatus M2 that receives the board request signal in ST3, ST5, ST7, and ST8 distributes the board 2 to any one of the transport lanes 8A and 8B which is a target. That is, the board distributing apparatus M2 distributes the board 2 to any one of the two transport lanes 8A and 8B based on the presence or absence of the board 2 in the carry-in areas 18A and 18B and the mounting areas 19A and 19B.

Figure 5A:
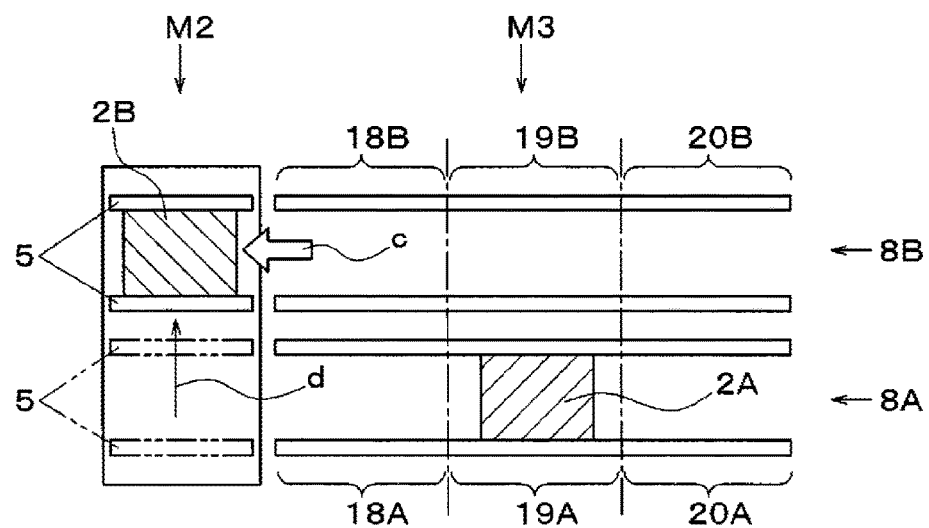
FIGS. 5A and 5B are diagrams illustrating a board transport operation according to Embodiment 1 of the present invention.

Next, two specific cases of the transport operation of the board 2 based on the flowchart shown in FIG. 4 will be described with reference to FIGS. 5A and 5B and FIGS. 6A and 6B. For ease of description, in FIGS. 5A and 5B and FIGS. 6A and 6B, the carry-in conveyors 15, the mounting conveyors 16, the carry-out conveyors 17, and the board detecting sensors 21 to 26 are not shown. FIG. 5A shows a first case where the boards 2 are absent in the carry-in areas 18A and 18B and the mounting area 19B and a board 2A is present in the mounting area 19A. In the first case, the control unit 30 outputs a board request signal for requesting a distribution of the board 2 to the second transport lane 8B where the board 2 is not present in the mounting area 19B to the board distributing apparatus M2 (arrow c) (ST7).

Figure 5B:
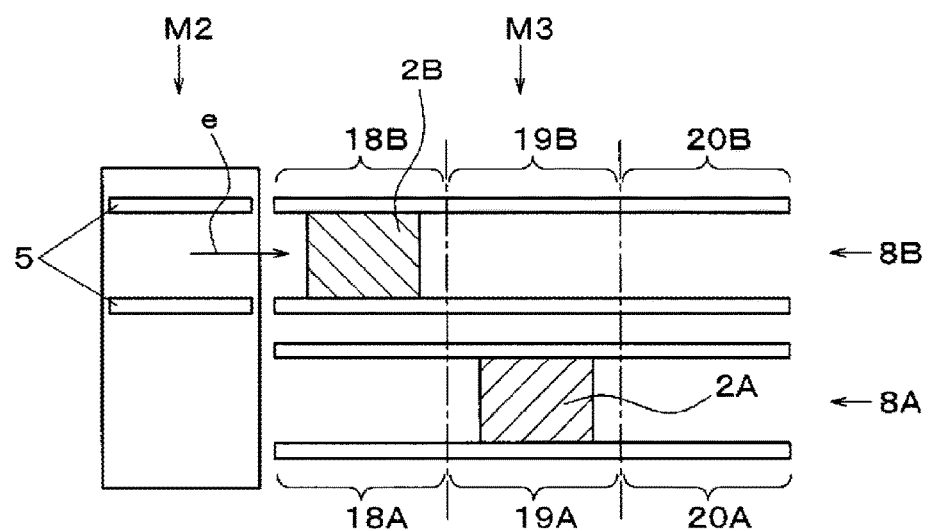

The board distributing apparatus M2 that receives the board request signal distributes the board 2 carried from the printer M1 to the second transport lane 8B. That is, the transport conveyors 5 move to a position which is arranged in parallel in the X direction with respect to the second transport lane 8B in a state where the board 2B is held (arrow d). Further, as shown in FIG. 5B, the transport conveyors 5 carry a board 2B to the carry-in area 18B (arrow e).

In this way, when the board 2A is present only in the mounting area 19A of one transport lane (first transport lane 8A) among the two transport lanes 8A and 8B, and when the boards 2 are absent in both the carry-in areas 18A and 18B of the two transport lanes 8A and 8B, the board distributing apparatus M2 distributes the board 2B to the other transport lane (second transport lane 8B) among the two transport lanes 8A and 8B. Thus, it is possible to rapidly execute the component mounting operation to suppress a reduction in production efficiency without the board 2B waiting in the carry-in area 18B, compared with a case where the board 2B is carried to the first transport lane 8A.

Figure 6A:
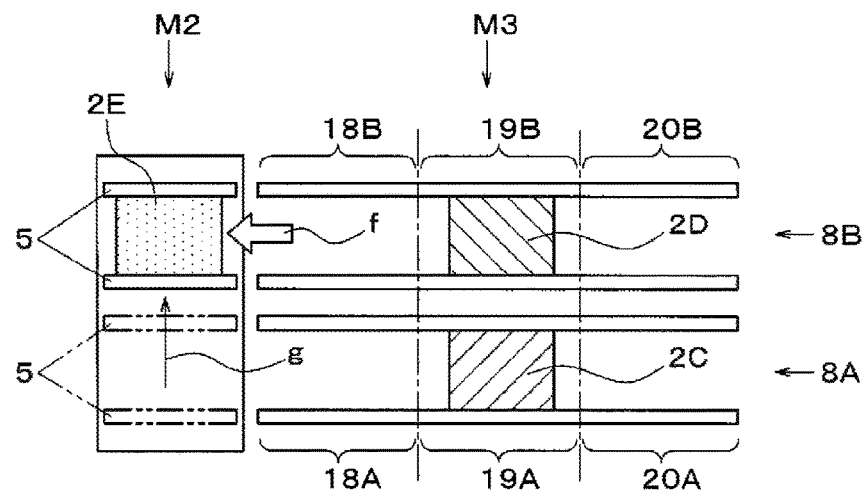
FIGS. 6A and 6B are diagrams illustrating a board transport operation according to Embodiment 1 of the present invention.
Figure 6B:
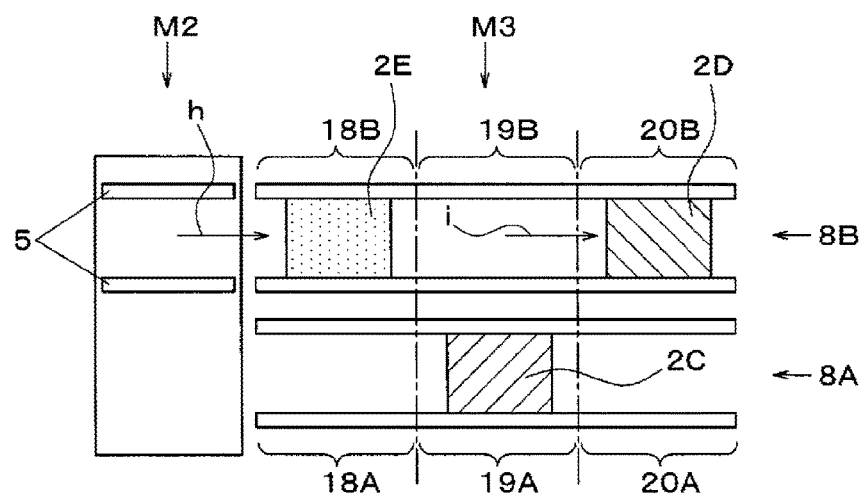

Next, FIG. 6A shows a second case where the boards 2 are absent in the carry-in areas 18A and 18B and boards 2C and 2D are present in both the mounting areas 19A and 19B. In the second case, detection results of the board 2 by the board detecting sensors 22 and 24 in both the transport lanes 8A and 8B are the same. Accordingly, the control unit 30 outputs a board request signal for requesting a distribution of the board 2 to the transport lane 8A or 8B where the component mounting operation is first terminated to the board distributing apparatus M2 (arrow f) (ST8). In this example, the component mounting operation for the board 2D that is present in the mounting area 19B is first terminated.

The board distributing apparatus M2 that receives the board request signal distributes a board 2E carried from the printer M1 to the second transport lane 8B. That is, the transport conveyor 5 moves to a position which is arranged in parallel in the X direction with the second transport lane 8B (arrow g shown in FIG. 6A), and carries the board 2E to the carry-in area 18B (arrow h shown in FIG. 6B). Then, if the component mounting operation for the board 2D is terminated, the mounting conveyors 16 carry the board 2D to the carry-out area 20B (arrow i). Further, the carry-in conveyors 15 carry the board 2E to the mounting area 19B. Then, the component mounting operation for the board 2E is executed.

In this way, when the boards 2C and 2D are present in both the mounting areas 19A and 19B of the two transport lanes 8A and 8B, and when the boards 2 are absent in both the carry-in areas 18A and 18B of the two transport lanes 8A and 8B, the board distributing apparatus M2 distributes the board 2E to the transport lane (second transport lane 8B) where the component mounting is first terminated among the two transport lanes 8A and 8B. Thus, the board 2E can be quickly subject to the component mounting operation compared with a case where the board 2E is carried to the first transport lane 8A. In this way, according to the component mounting line 1 and the component mounting apparatus M3 that forms the component mounting line 1, it is possible to suppress a reduction in production efficiency by carrying the board 2 to an appropriate transport lane 8A or 8B.

Next, a component mounting method according to the present embodiment will be described. That is, the control unit 30 executes the board request signal output process described above. The control unit 30 determines which one of the transport lanes 8A and 8B the board 2 from the board distributing apparatus M2 is carried to based on the presence or absence of the board 2 in the carry-in areas 18A and 18B and the mounting areas 19A and 19B, and outputs a board request signal for requesting a distribution of the board to the determined transport lane 8A or 8B to the board distributing apparatus M2 (ST3, ST5, ST7, and ST8: board request signal output processes). Then, the board distributing apparatus M2 distributes the board 2 to the transport lane 8A or 8B for which the board 2 is requested (ST9: board distributing process). Then, the transport lane 8A or 8B which is a distribution destination transports the board 2 to the mounting operation position (ST10: board transport process). Thereafter, the mounting head 13A or 13B mounts the component onto the distributed board 2 (ST11: component mounting process).

Embodiment 2

Figure 7:
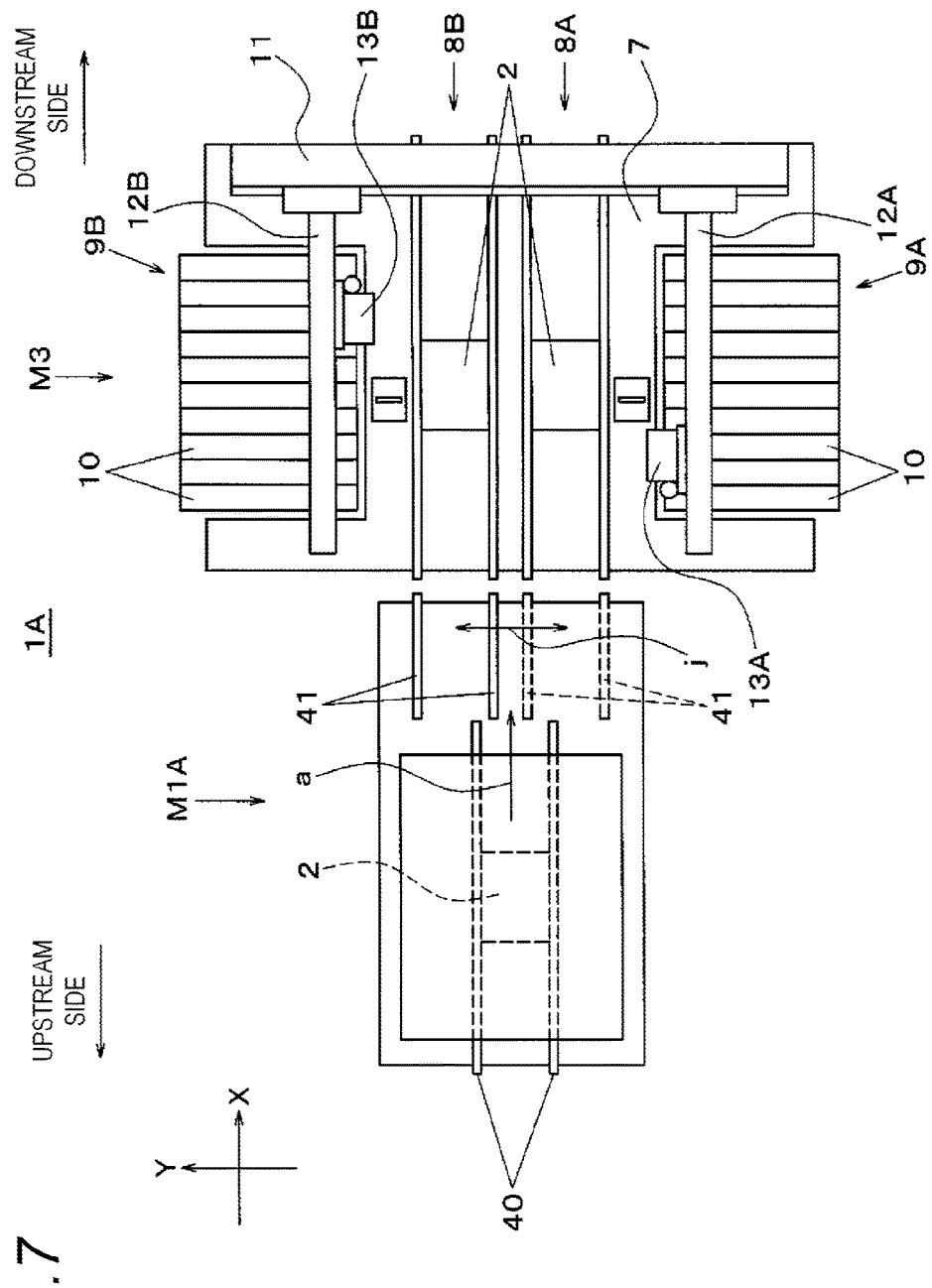
FIG. 7 is a plan view of a component mounting line according to Embodiment 2 of the present invention.

Next, Embodiment 2 of the present invention will be described with reference to FIG. 7. Embodiment 2 is different from Embodiment 1 in that a board distributing apparatus is not independently provided. That is, a component mounting line 1A includes a printer M1A and a component mounting apparatus M3 that are arranged to be adjacent to each other in the X direction. The printer M1A has a function of distributing the board 2 to the transport lane 8A or 8B provided in the component mounting apparatus M3, in addition to a function of printing solder paste to an electrode of the board 2. Since the component mounting apparatus M3 is the same as in Embodiment 1, a description thereof will not be repeated.

The printer M1A includes a pair of transport conveyors 40 that extend in the X direction, and distributing conveyors 41 disposed on the downstream side of the transport conveyors 40. The transport conveyors 40 carry the board 2 in which the solder paste is printed to the distributing conveyors 41. The distributing conveyors 41 are movable in the Y direction (arrow j) by a conveyor movement mechanism (not shown), and distribute the board 2 carried from the transport conveyors 40 to any one of the first transport lane 8A and the second transport lane 8B. The board distributing apparatus that forms the present invention includes the board distributing apparatus M2 (Embodiment 1) that is independently provided in the component mounting line 1, and the distributing conveyors 41 (Embodiment 2) provided in the printer M1A.

In Embodiment 2, the control unit 30 provided in the component mounting apparatus M3 outputs a board request signal to the printer M1A. The distributing conveyors 41 receive the board request signal and then move to a position which is arranged in parallel in the X direction with respect to the transport lane 8A or 8B for which the board request signal is received, and carry the board 2 to a predetermined transport lane 8A or 8B. Using the component mounting line 1A, similarly, it is possible to carry the board 2 to an appropriate transport lane 8A or 8B, to thereby suppress a reduction in production efficiency.

According to one or more embodiments of the present invention, it may be possible to carry a board to an appropriate transport lane to suppress a reduction in production efficiency, which is useful in a field where a component-mounted board is produced.

What is claimed is:

1. A component mounting method in a component mounting apparatus that mounts a component onto a board distributed by a board distributing apparatus, in which the component mounting apparatus includes two transport lanes, each having a carry-in area where the board distributed by the board distributing apparatus is carried and a mounting area where the component is mounted on the board received from the carry-in area, the method comprising:
   distributing one or more boards to one or both of the two transport lanes;
   determining which one of the two transport lanes the board from the board distributing apparatus is carried to based on a presence or absence of the one or more boards in the carry-in area and the mounting area, and outputting a board request signal for requesting a distribution of the board to the determined transport lane to the board distributing apparatus; and
   mounting the component onto the board distributed to the transport lane for which the board is requested.

2. The component mounting method according to claim 1, wherein when the one or more boards are present in only the mounting area of one transport lane among the two transport lanes and no boards are present in the carry-in areas of the two transport lanes, the board distributing apparatus distributes the board to the other transport lane among the two transport lanes.

3. The component mounting method according to claim 1, wherein when the one or more boards are present in the mounting areas of both of the two transport lanes and no boards are present in the carry-in areas of the two transport lanes, the board distributing apparatus distributes the board to a transport lane where component mounting is first terminated among the two transport lanes.

* * * * *